US008766391B2

(12) United States Patent
Nozaki

(10) Patent No.: US 8,766,391 B2
(45) Date of Patent: Jul. 1, 2014

(54) PHOTODETECTOR ARRAY HAVING ARRAY OF DISCRETE ELECTRON REPULSIVE ELEMENTS

(75) Inventor: Hidetoshi Nozaki, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 165 days.

(21) Appl. No.: 13/430,193

(22) Filed: Mar. 26, 2012

(65) Prior Publication Data

US 2012/0181552 A1    Jul. 19, 2012

Related U.S. Application Data

(62) Division of application No. 12/612,552, filed on Nov. 4, 2009, now Pat. No. 8,227,884.

(51) Int. Cl.
*H01L 21/00* (2006.01)
*H01L 27/146* (2006.01)

(52) U.S. Cl.
CPC .... *H01L 27/14601* (2013.01); *H01L 27/14683* (2013.01); *H01L 27/1464* (2013.01)
USPC ............... 257/447; 257/21; 257/84; 257/85; 257/184; 257/232; 257/233; 257/E27.133; 257/E27.162; 257/E31.07; 257/E31.127

(58) Field of Classification Search
CPC ................... H01L 27/14601; H01L 27/14683; H01L 27/1464
USPC ........ 257/84, 447, E27.133, 21, 85, 184, 232, 257/233, 432, E27.162, E31.07, E31.127
See application file for complete search history.

(56) References Cited

U.S. PATENT DOCUMENTS

| | | | |
|---|---|---|---|
| 6,417,022 B1 | 7/2002 | Hsiao | |
| 6,638,786 B2 | 10/2003 | Yamamoto | |
| 6,690,049 B2 | 2/2004 | Suzuki et al. | |
| 7,589,306 B2 | 9/2009 | Venezia et al. | |
| 2006/0043519 A1 | 3/2006 | Ezaki | |
| 2008/0011963 A1 | 1/2008 | Hiramoto | |
| 2008/0099804 A1 | 5/2008 | Venezia | |

(Continued)

FOREIGN PATENT DOCUMENTS

CN    1763965    4/2006

OTHER PUBLICATIONS

Ershov, et al., "High-Speed Performance of Quantum Well Infrared Photodetectors", p. 258.

(Continued)

*Primary Examiner* — Long K Tran
(74) *Attorney, Agent, or Firm* — Blakely Sokoloff Taylor & Zafman LLP

(57) ABSTRACT

Photodetector arrays, image sensors, and other apparatus are disclosed. In one aspect, an apparatus may include a surface to receive light, a plurality of photosensitive regions disposed within a substrate, and a material coupled between the surface and the plurality of photosensitive regions. The material may receive the light. At least some of the light may free electrons in the material. The apparatus may also include a plurality of discrete electron repulsive elements. The discrete electron repulsive elements may be coupled between the surface and the material. Each of the discrete electron repulsive elements may correspond to a different photosensitive region. Each of the discrete electron repulsive elements may repel electrons in the material toward a corresponding photosensitive region. Other apparatus are also disclosed, as are methods of use, methods of fabrication, and systems incorporating such apparatus.

10 Claims, 10 Drawing Sheets

(56) References Cited

U.S. PATENT DOCUMENTS

| | | |
|---|---|---|
| 2008/1013596 | 6/2008 | Akiyama |
| 2008/0210985 A1 | 9/2008 | Ogawa |
| 2008/0224247 A1 | 9/2008 | Hsu et al. |
| 2009/0200585 A1 | 8/2009 | Nozaki et al. |
| 2009/0230394 A1 | 9/2009 | Nagaraja et al. |
| 2009/0267070 A1 | 10/2009 | Venezia et al. |

OTHER PUBLICATIONS

Goodyear, et al., "Lens Etching for Photonic Applications", Oxford Instruments, Oct. 2003, pp. 1-5.

Cox, et al., "Microlens Formation Using Heavily Dyed Photoresist in a Single Step", Proceedings of SPIE, vol. 6153, 2006, pp. 1-7.

METHOD OF USING
PHOTODETECTOR
ARRAY
220

```
┌─────────────────────────────────────┐
│ RECEIVE LIGHT AT SURFACE OF         │── 221
│ PHOTODETECTOR ARRAY                 │
└─────────────────────────────────────┘
                 ↓
┌─────────────────────────────────────┐
│ TRANSMIT LIGHT TOWARD               │── 222
│ PHOTOSENSITIVE REGIONS              │
└─────────────────────────────────────┘
                 ↓
┌─────────────────────────────────────┐
│ FREE ELECTRONS IN MATERIAL WITH LIGHT│── 223
└─────────────────────────────────────┘
                 ↓
┌─────────────────────────────────────┐
│ GENERATE INTERRUPTED ELECTRIC       │── 224
│ FIELDS IN MATERIAL, EACH INTERRUPTED│
│ ELECTRIC FIELD CORRESPONDING TO ONE │
│ OF PHOTOSENSITIVE REGIONS           │
└─────────────────────────────────────┘
                 ↓
┌─────────────────────────────────────┐
│ DRIVE ELECTRONS IN MATERIAL TOWARD  │── 225
│ TE PHOTOSENSITIVE REGIONS WITH      │
│ ELECTRIC FIELDS                     │
└─────────────────────────────────────┘
                 ↓
┌─────────────────────────────────────┐
│ RECEIVE ELECTRONS AT PHOTOSENSITIVE │── 226
│ REGIONS                             │
└─────────────────────────────────────┘
```

*FIGURE 2*

PHOTODETECTOR ARRAY HAVING ARRAY OF DISCRETE ELECTRON REPULSIVE ELEMENTS

This application is a divisional of U.S. application Ser. No. 12/612,552, filed on Nov. 4, 2009 now U.S. Pat. No. 8,227,884, and priority is claimed thereof. U.S. application Ser. No. 12/612,552 is incorporated herein by reference.

BACKGROUND

Background Information

Image sensors are prevalent. The image sensors may be used in a wide variety of applications, such as, for example, digital still cameras, cellular phones, digital camera phones, security cameras, optical mice, as well as various other medical, automobile, military, or other applications.

Electrical crosstalk is one challenge encountered by many image sensors. Electrical crosstalk may occur, for example, when an electron generated in a region corresponding to one photosensitive region diffuses, laterally drifts, or otherwise migrates or moves to and is collected by a neighboring photosensitive region. The electrons may end up being collected by the neighboring photosensitive region.

Such electrical crosstalk tends to be undesirable, since it may tend to blur images, introduce artifacts, or otherwise reduce image quality. In addition, such crosstalk may tend to become a bigger challenge as the size of the image sensors and their pixels continues to decrease.

Image sensors and other photodetector arrays having reduced electrical crosstalk offer certain advantages.

BRIEF DESCRIPTION OF THE SEVERAL VIEWS OF THE DRAWINGS

The invention may best be understood by referring to the following description and accompanying drawings that are used to illustrate embodiments of the invention. In the drawings:

FIG. 2 is a block flow diagram of a method of using a photodetector array including generating interrupted electric fields in a material, according to embodiments of the invention.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
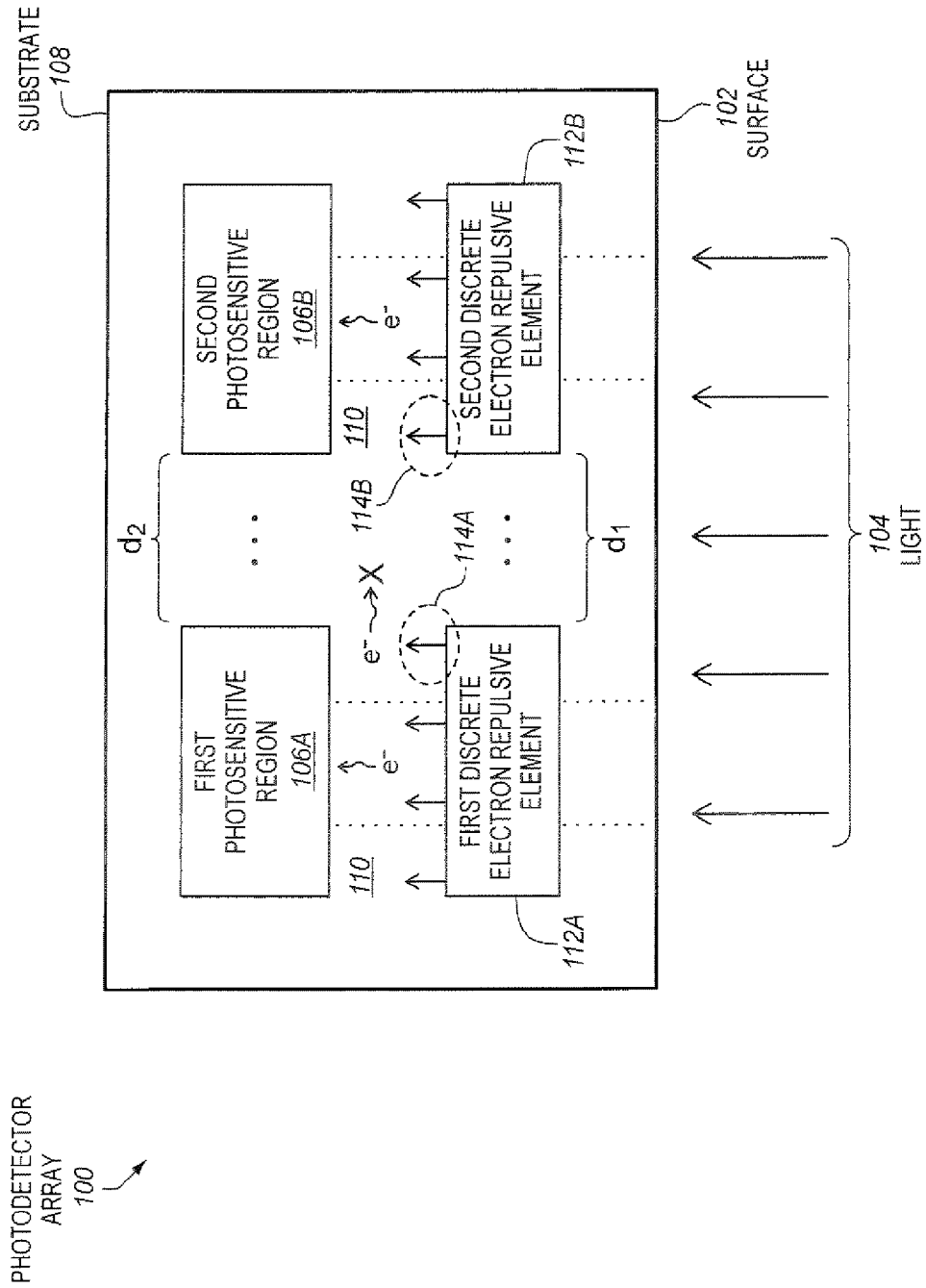
FIG. 1 is a cross-sectional side view of a photodetector array having discrete electron repulsive elements, according to embodiments of the invention.

FIG. 1 is a cross-sectional side view of a photodetector array 100, according to embodiments of the invention. The photodetector array includes a light collection surface 102, such as, for example, a surface of one or more lenses. During operation, the light collection surface may receive light 104.

The photodetector array also includes a plurality of photosensitive regions 106A, 106B. In the illustration, for simplicity of illustration, a first photosensitive region 106A and a second photosensitive region 106B are shown, although it is to be appreciated that more (e.g., an array of photosensitive regions of any appropriate number and size) may optionally be included.

Photosensitive regions 106A and 106B are disposed within a substrate 108. As used herein, a photosensitive region disposed within a substrate is intended to encompass a photosensitive region formed within the substrate, a photosensitive region formed over the substrate, or a photosensitive region formed partly within and partly over the substrate. Typically, the photosensitive regions are disposed within a semiconductor material of the substrate. The substrate may also include other materials in addition to semiconductor materials, such as, for example, organic materials, metals, and non-semiconductor dielectrics, to name just a few examples.

Representative examples of suitable photosensitive regions include, but are not limited to, photodiodes, charge-coupled devices (CCDs), quantum device optical detectors, photogates, phototransistors, and photoconductors. Types of photosensitive regions used in complementary metal-oxide-semiconductor (CMOS) active-pixel sensors (APS) are believed to be especially suitable. In one embodiment, the photosensitive region is a photodiode. Representative examples of suitable photodiodes include, but are not limited to, P-N photodiodes, PIN photodiodes, and avalanche photodiodes.

Referring again to FIG. 1, the photodetector array also includes a material 110. Material 110 is coupled between surface 102 and photosensitive regions 106A and 106B. In one or more embodiments, the material may include a semiconductor material. During operation, material 110 may receive the light that was received by light collection surface 102. The material may transmit the light toward the plurality of photosensitive regions. Dashed lines are used to show possible paths of the light. The light may penetrate all the way to the photosensitive region, or only part way to the photosensitive region, depending upon the transparence of the material, the thickness of the material, and the wavelength of the light. In the illustration, a single material has been shown, although it is to be appreciated that material 110 may include two or more different materials.

At least some of the light may be operable to free electrons (e−), such as, for example, photoelectrons, in the material. For example, electrons may be generated or freed in a material, such as a semiconductor material, due to the photoelectric effect. These electrons (e−) are capable of diffusing or otherwise moving within the material. In order to be detected in conjunction with sensing or detecting the light, the electrons (e−) should move toward the photosensitive regions. In addition, for high image fidelity, the electrons generated in the material below photosensitive region 106A should preferably move toward photosensitive region 106A, and the electrons generated in material below photosensitive region 106B should preferably move toward photosensitive region 106B. Accordingly, the electrons have a path or distance to move through the material before reaching the photosensitive regions.

Notice that the photodetector array also includes a plurality of discrete electron repulsive elements 112A, 112B, according to embodiments of the invention. In the illustration, for simplicity of illustration, a first discrete electron repulsive element 112A and a second discrete electron repulsive element 112B are shown, although it is to be appreciated that more (e.g., an array of any appropriate number and size) may optionally be included. The discrete electron repulsive elements are coupled between surface 102 and material 110.

In various embodiments, discrete electron repulsive elements 112A and 112B may represent a modified portion of material 110 or a material deposited or otherwise formed over material 110. For example, in one or more embodiments, the discrete electron repulsive elements may each include a discrete more heavily doped region (e.g., a p+ doped region) within a less heavily doped (e.g., a p-type) semiconductor material 110. As another example, in one or more embodiments, the discrete electron repulsive elements may each include a discrete thin metal layer formed over an underlying material 110 in which the metal layer is operable to create a hole accumulation region in an adjacent portion of material 110 (e.g., a metal flash gate).

As used herein, the term "element", as in discrete electron repulsive element, is to be interpreted sufficiently broadly to encompass a material, a region or portion of a layer, a region or portion of a substrate (e.g., a more heavily doped region within a less heavily doped semiconductor material), a portion of a patterned layer (e.g., a discrete portion of a patterned thin metal film or layer), as well as other structures and component parts of photodetector arrays or image sensors. These discrete electron repulsive elements represent one possible means for repelling, forcing, or encouraging the movement of electrons.

Each of the discrete electron repulsive elements is aligned or positioned relative to, or otherwise corresponds to, a different photosensitive region. In particular, a first discrete electron repulsive element 112A corresponds to the first photosensitive region 106A, and a second discrete electron repulsive element 112B corresponds to the second photosensitive region 106B.

The electron repulsive elements are discrete. As shown, the electron repulsive elements may be physically separated from one another and/or may not directly contact or connect to one another. As shown, an intervening gap or other distance (d1) may separate the discrete electron repulsive elements. The gap need not be empty but rather may be occupied by a material that is different than a material of the discrete elements. Accordingly, rather than being continuous (e.g., an uninterrupted layer) over two or more photosensitive regions, the discrete electron repulsive elements may be discretely, individually, intermittently, discontinuously, and/or periodically formed over individual photosensitive regions. Each of the discrete electron repulsive elements may overly only one corresponding photosensitive region instead of multiple photosensitive regions or an entire array of photosensitive regions.

Each of the discrete electron repulsive elements is operable to repel or force electrons in the material toward its corresponding photosensitive region. During operation, each of the discrete electron repulsive elements may generate a corresponding discrete electric field 114A, 114B in the material. In particular, first discrete electron repulsive element 112A is capable of generating a first discrete electric field 114A. Likewise, second discrete electron repulsive element 112B is capable of generating a second discrete electric field 114B.

In the illustration, the electric fields are represented by a number of short arrows with tails originating at the discrete electron repulsive elements and with heads pointing toward the corresponding photosensitive regions. These arrows represent lines of force acting upon the electrons. As shown, the lines of force are substantially parallel and point directly at the corresponding photosensitive regions.

The electric fields are operable to repel or force the electrons in the material toward their corresponding photosensitive regions. In particular, first discrete electric field 114A is capable of repelling electrons in the intervening material toward corresponding photosensitive region 106A. Likewise, second discrete electric field 114B is capable of repelling electrons in the intervening material toward corresponding photosensitive region 106B.

Electrons that linger too long in the material tend to be eliminated, such as, for example, by recombining with backside surface defects. By forcing the electrons toward the photosensitive regions, the electrons are less likely to be eliminated, and are more likely to move toward the photosensitive regions and be collected. Accordingly, one potential advantage of the electron repulsive elements is that they may help to improve sensitivity and collection efficiency.

Another advantage of the discrete electron repulsive elements is that they may help to reduce electrical crosstalk. There is a tendency for some of the electrons to laterally diffuse, drift, or otherwise migrate or move away from their corresponding photosensitive region. In some cases the stray electrons may be collected by a neighboring photosensitive region. This is known as electrical crosstalk. Electrical crosstalk tends to be more likely for electrons generated near the edge of a photosensitive region than for electrons generated near the center of a photosensitive region. Electrons generated between photosensitive regions may migrate to either of the photosensitive regions. In addition, electrical crosstalk tends to increase as the pixel size decreases. Such electrical crosstalk is generally undesirable because it may tend to cause blurring or otherwise adversely affect image quality or fidelity.

Recall that the electron repulsive elements are discrete. They may be physically separated from one another by a distance (d1). The discrete electron repulsive elements may generate corresponding discrete, interrupted, or discontinuous electric fields 114A, 114B. The electric fields may be stronger or have a greater magnitude in regions of the material directly under (as viewed) a corresponding photosensitive regions than in regions of the material between adjacent photosensitive regions.

Electrons in the regions directly under (as viewed) photosensitive regions may be forced or repelled toward the photosensitive regions more strongly than electrons in regions between adjacent photosensitive regions. As a result, potentially stray electrons in the regions between adjacent photosensitive regions may linger or remain in these regions for longer periods of time, and may be more likely to recombine with backside defects or otherwise be eliminated than the electrons in the regions directly over the photosensitive regions. Advantageously, eliminating these potentially stray electrons may tend to reduce electrical crosstalk. Such reduction of electrical crosstalk may be even more advantageous if the past and present trend toward smaller pixel sizes is to continue.

Conversely, if instead a continuous layer of electron repulsive material existed over the photosensitive regions, including over the region of the material between the photosensitive regions, then the electric field generated by such a layer would tend to push the electrons in the regions between the photosensitive regions toward the photosensitive regions. As a result, potentially stray electrons in these regions would be pushed toward the photosensitive regions, and would be more likely to contribute to electrical crosstalk.

In embodiments, each of the discrete electron repulsive elements may have an extent that is based on an extent of the corresponding photosensitive region. In one or more embodiments, each of the discrete electron repulsive elements may have an extent that is substantially commensurate with an extent of the corresponding photosensitive region. As used herein, a substantially commensurate extent means that the area or footprint of the discrete electron repulsive element overlies only one corresponding photosensitive region, and that an area or footprint of a discrete electron repulsive element is at least $1/10$ that of a corresponding photosensitive region. Often, the discrete elements may have areas or footprints that are at least $1/5$, in some cases at least $1/2$, of the areas or footprints of their corresponding photosensitive region. In various embodiments, the distance (d1) separating the discrete elements is typically at least $1/10$, often at least $1/5$, in some cases at least $1/3$, and in certain cases at least $1/2$ a distance (d2) separating the adjacent photosensitive regions. In one or more embodiments, the boundaries or extends of the discrete electron repulsive elements may be substantially coextensive or coterminous with the boundaries or extends of the corresponding photosensitive regions, although this is not required.

The size of the discrete electron repulsive elements relative to the size of the pixels may be selected to achieve a desired balance between collection efficiency and electrical crosstalk that is appropriate for a particular implementation. The elements may either be relatively smaller, in which case they will tend to provide relatively more reduction of electrical crosstalk, although also relatively less improvement in collection efficiency. Alternatively, the elements may be relatively larger, in which case they will tend to provide relatively less reduction of electrical crosstalk, although relatively more improvement in collection efficiency.

FIG. 2 is a block flow diagram of a method 220 of using a photodetector array, according to embodiments of the invention. By way of example, the method may be performed with photodetector array 100 shown in FIG. 1, or one similar.

The method includes receiving light at a portion of a surface of the photodetector array, at block 221. In one or more embodiments, the photodetector array may be used as an image sensor, and the light may be light reflected by an object or surface being imaged, which may be used to generate an image of the object or surface. However, the scope of the invention is not limited to image sensors.

The light may be transmitted toward a plurality of photosensitive regions (e.g., two or more or any array), at block 222. In some cases, the light may be transmitted at least part way through one or more materials. Electrons may be generated, released, or otherwise freed in a material with the light, at block 223. For example, photoelectrons may be freed in a semiconductor material or other material by the light due to the photoelectric effect.

A plurality of interrupted electric fields (e.g., two or more or an array) may be generated in the material, at block 224. Each of the interrupted electric fields may correspond to, and be generated by, one of the photosensitive regions. The interrupted electric fields may be discrete, separate from one another, or discontinuous. The electric fields may be stronger or have a greater magnitude in regions of the material directly under (as viewed) a corresponding photosensitive regions than in regions of the material between adjacent photosensitive regions. It is to be appreciated that the fields may be generated even before the electrons are freed.

The electrons in the material may be driven or forced toward the photosensitive regions with the electric fields, at block 225. Electrons in the regions of the material directly under (as viewed) photosensitive regions may be forced or repelled toward the photosensitive regions more strongly than electrons in regions between adjacent photosensitive regions. A greater proportion of electrons in the regions of the material between adjacent photosensitive regions may be eliminated than for the electrons in the regions directly under (as viewed) the photosensitive regions. Advantageously, this may help to reduce electrical crosstalk.

The electrons, and any remaining light, may be received at the photosensitive regions, at block 226. As is known, the photosensitive regions may generate analog signals representing the amount of electrons and light detected. The analog signals may be used for various purposes. In some cases, the photodetector array may be used as an image sensor, and the analog signals may be used to generate an image. Other uses are also contemplated.

To better illustrate certain concepts, an example of discrete electron repulsive elements incorporated in a particular example of a photodetector array will be discussed. This particular photodetector array is a backside illuminated (BSI) photodetector array having a particular configuration and particular components, including optional components. However, it is to be appreciated that the scope of the invention is not limited to this particular photodetector array.

Figure 3:
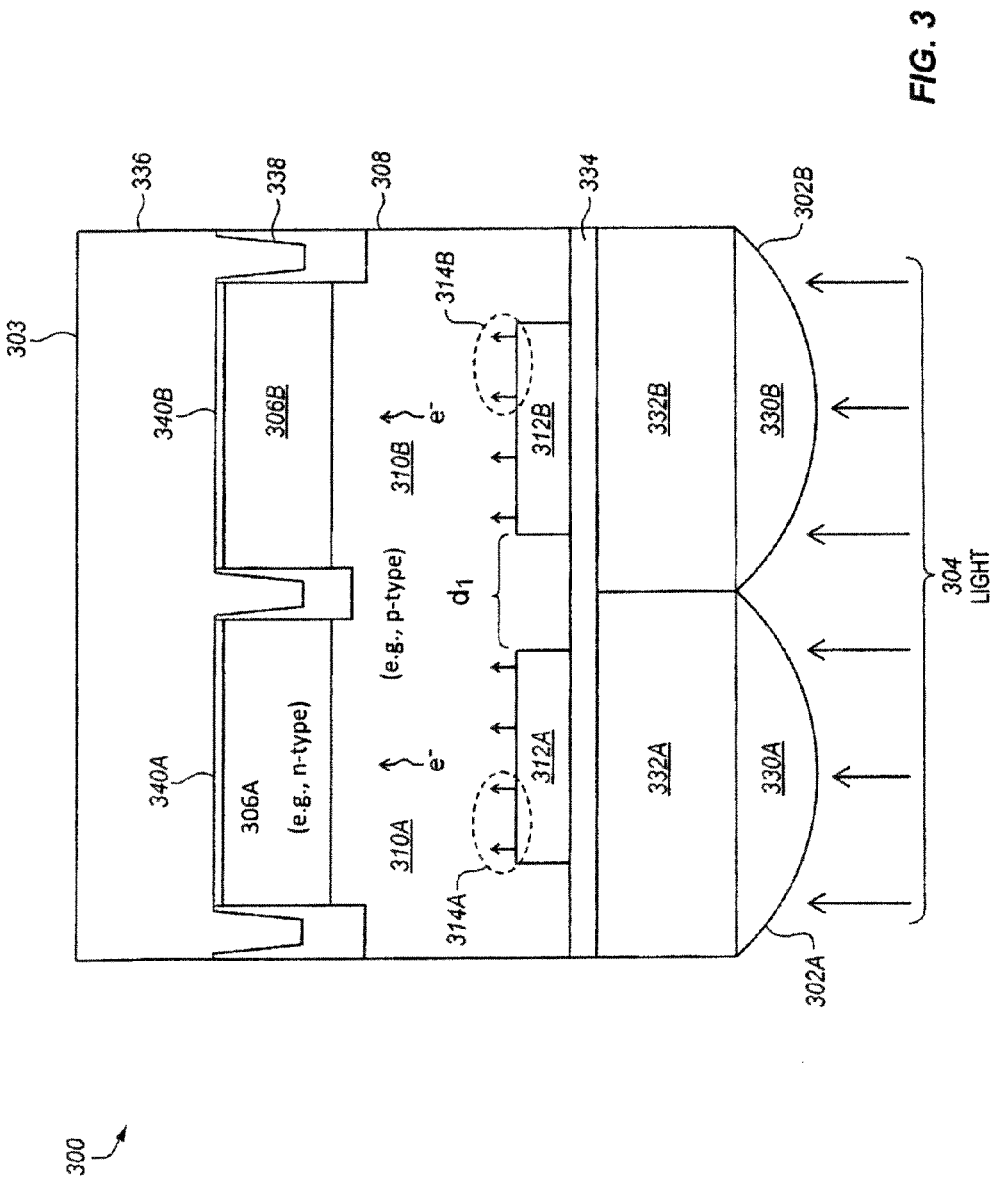
FIG. 3 is a cross-sectional side view of a backside-illuminated (BSI) photodetector array having discrete electron repulsive elements, according to one or more embodiments of the invention.

FIG. 3 is a cross-sectional side view of a BSI photodetector array 300, according to one or more embodiments of the invention.

Many photodetector arrays today are front side illuminated (FSI). These FSI photodetector arrays include an array of photosensitive regions at the front side of a substrate, and during operation the array of photosensitive regions receives light from the front side. However, FSI photodetector arrays have certain drawbacks, such as, for example, a limited fill factor.

BSI photodetector arrays are an alternative to FSI photodetector arrays. The BSI photodetector arrays include an array of photosensitive regions at or disposed within the front side of a substrate. During operation the array of photosensitive regions receives light from the backside of the substrate.

Referring again to FIG. 3, the BSI photodetector array includes a front side surface 303 and a backside surface 302A, 302B. During operation, light 304 may be received at the backside surface.

In one or more embodiments, the backside surface may be surfaces of an optional array of microlenses 330A, 330B. In the illustration, for simplicity of illustration, two microlenses are shown, although it is to be appreciated that more (e.g., an array of any appropriate number and size) may optionally be included. The microlenses typically have diameters that are less than 10 um. The microlenses are optically aligned to focus the light received at the backside surface toward corresponding photosensitive regions. The microlenses help to improve sensitivity and reduce optical crosstalk. However, the microlenses are optional, and not required.

The photodetector array also includes an array of photosensitive regions 306A, 306B. The array of photosensitive regions is disposed within a substrate 308.

The photodetector array also includes a material 310A, 310B. The material, such as, for example, epitaxial silicon or another semiconductor material, is coupled between the backside surface and the array of photosensitive regions. The material is to receive the light being transmitted toward the array of photosensitive regions. At least some of the light may free electrons (e−) in the material.

Notice that the photodetector array also includes a plurality of discrete electron repulsive elements 312A, 312B. Discrete electron repulsive elements 312A, 312B are coupled between microlenses 330A, 330B (providing the backside surface) and material 310A, 310B, respectively. As mentioned above, the discrete electron repulsive elements may be discrete materials, discrete layer portions, or discrete regions or portions of a substrate, to name a few examples. The discrete electron repulsive elements may be physically separated elements that are separated from one another by an intervening gap or distance (d1).

Discrete electron repulsive element 312A is capable of generating a discrete electric field 314A that is capable of forcing electrons (e−) in material 310A toward corresponding photosensitive region 306A. Likewise, discrete electron repulsive element 312B is capable of generating a discrete electric field 314B that is capable of forcing electrons (e−) in material 310B toward corresponding photosensitive region 306B. As discussed above, forcing the electrons toward the photosensitive regions may help to improve sensitivity and collection efficiency.

The electric fields are discrete or interrupted. The electric fields may have a greater magnitude in regions of the material directly under (as viewed) corresponding photosensitive regions than in regions of the material between adjacent photodetectors. Electrons in the regions directly under photosensitive regions may be forced or repelled toward the photodetectors more strongly than electrons in regions between adjacent photosensitive regions. As a result, potentially stray electrons in the regions between adjacent photosensitive regions may be more likely to recombine with backside defects or otherwise be eliminated than the electrons in the regions directly under the photosensitive regions. Advantageously, this may tend to reduce electrical crosstalk.

Referring again to FIG. 3, the photodetector array also includes optional conventional color filters 332A, 332B coupled between material 310A, 310B and microlenses 330A, 330B, respectively. Color filter 332A is operable to filter a different color than color filter 332B. These color filters are optional and not required. For example, these color filters may be omitted in the case of a black and white image sensor, or otherwise.

The photodetector array also includes an optional layer 334, such as, for example, a conventional planarization, a conventional antireflective layer, or both, coupled between color filters 332A, 332B and material 310A, 310B. This layer is optional. Antireflection is not required, and the planarization layer may be omitted if the backside surface of the color filters are, or can be made to be, sufficiently planar.

The photodetector array includes a conventional interconnect portion 336 at the front side thereof. The interconnect portion may include one or more conventional metal interconnect layers (not shown) disposed within dielectric material. Conventional shallow trench isolation (STI) 338 may optionally be included between adjacent photosensitive regions. Optional conventional pinning layers 340A, 340B, such as, for example, p+ doped semiconductor regions in the case of n-type photosensitive regions, may be disposed on the front surfaces of each of the photosensitive regions.

Different types of materials are capable of generating electric fields. A few representative materials will be discussed.

Figure 4A:
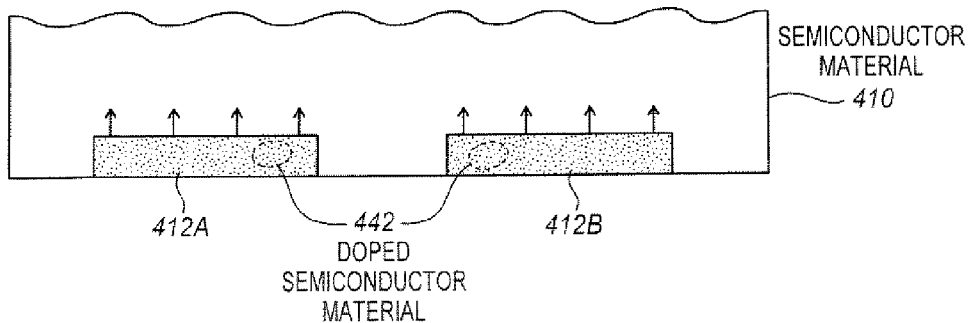
FIG. 4A shows a simplified cross-sectional side view of a portion of a photodetector array having discrete electron repulsive elements that have a first example type of material, according to one or more embodiments of the invention.

FIG. 4A shows a simplified cross-sectional side view of a portion of a photodetector array having discrete electron repulsive elements 412A, 412B that each include a first example type of material 442 that is capable of generating electric fields in a material 410, according to one or more embodiments of the invention. First example material 442 of this embodiment is a doped or heavily doped semiconductor material in a less heavily doped semiconductor material 410.

As is known, a semiconductor may be doped with a dopant to alter its electrical properties. Dopants may either be acceptors or donors.

Acceptor elements generate free holes in the semiconductor by accepting electrons from semiconductor atoms and releasing holes. Suitable acceptors for silicon include boron, indium, gallium, aluminum, and combinations thereof.

Donor elements generate free electrons in the semiconductor by donating electrons to semiconductor atoms. Suitable donors for silicon include phosphorous, arsenic, antimony, and combinations thereof.

A "p-type semiconductor", a "semiconductor of p-type conductivity", or the like, refers to a semiconductor doped with an acceptor, and in which the concentration of holes is greater than the concentration of free electrons. The holes are majority carriers and dominate conductivity.

An "n-type semiconductor", a "semiconductor of n-type conductivity", or the like, refers to a semiconductor doped with a donor and in which the concentration of free electrons is greater than the concentration of holes. The electrons are majority carriers and dominate conductivity.

P-type and n-type semiconductors are generally doped with light to moderate concentrations of dopant. As used herein, p-type and n-type semiconductors have concentrations of dopant that are less than $1 \times 10^{16}$ dopants/cm$^3$.

A "p+ semiconductor", a "p+ doped semiconductor", a "semiconductor of p+ conductivity", or the like, refers to a heavily doped p-type semiconductor that is heavily doped with donor elements. A "n+ semiconductor", a "n+ doped semiconductor", a "semiconductor of n+ conductivity", or the like, refers to a heavily doped n-type semiconductor that is heavily doped with acceptor elements. As used herein, p+ doped semiconductors and n+ doped semiconductors have concentrations of dopant that are more than $1\times10^{16}$ dopants/$cm^3$, often more than $1\times10^{17}$ dopants/$cm^3$.

In one or more embodiments, discrete electron repulsive elements 412A, 412B may each include a discrete doped or heavily doped semiconductor region or material 442 in, within, on, or adjacent to a less heavily doped semiconductor material 410. For example, each of the discrete electron repulsive elements may include a p+ doped semiconductor region or material 442, and semiconductor material 410 may include a p-type epitaxial semiconductor material, layer, or substrate portion. Opposite polarity configurations are also potentially suitable (e.g., a hole accumulation photodiode).

A thickness of the doped or heavily doped semiconductor material of the discrete electron repulsive elements may range from about 50 nanometers (nm) to about 400 nm, although this is not required. In some cases the thickness may range from about 80 nm to about 200 nm.

In one or more embodiments of the invention, an optional doping concentration gradient or slope may exist across a thickness of the doped semiconductor material of the discrete electron repulsive elements. For example, the discrete electron repulsive elements may each have a greater dopant concentration at a backside surface or portion thereof and a lesser dopant concentration at a frontside surface or portion thereof. In one or more embodiments, the greater dopant concentration at the backside portion may range from about $1\times10^{17}$ dopants/$cm^3$ to about $1\times10^{21}$ dopants/$cm^3$. In one or more embodiments, the lesser dopant concentration at the frontside portion may range from about $1\times10^{14}$ dopants/$cm^3$ to about $1\times10^{16}$ dopants/$cm^3$. A relatively steep concentration gradient tends to work well. However, the scope of the invention is not limited to using a concentration gradient, let alone any particular concentration gradient.

In this embodiment, the doped or heavily doped materials of the discrete electron repulsive elements are separated by a portion of undoped or lesser doped semiconductor. In one or more embodiments, a thinner, and less heavily doped semiconductor material still doped higher than the bulk of the semiconductor material may be used in between the discrete electron repulsive elements.

Figure 4B:
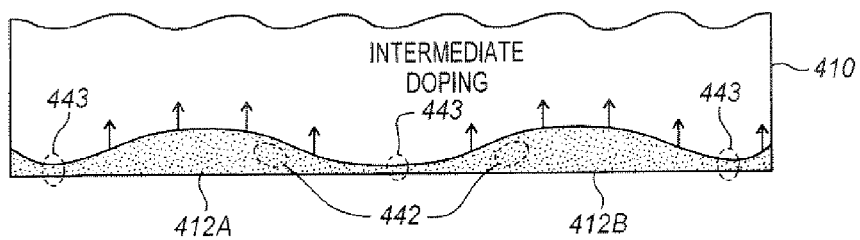
FIG. 4B shows a simplified cross-sectional side view of a portion of a photodetector array having discrete electron repulsive elements that each include the first example type of material of FIG. 4A, and having an intermediately doped semiconductor material in regions between discrete electron repulsive elements, according to one or more embodiments of the invention.

FIG. 4B shows a simplified cross-sectional side view of a portion of a photodetector array having discrete electron repulsive elements 412A, 412B that each include the first example type of material 442 of FIG. 4A, and having an intermediately doped semiconductor material 443 in regions between discrete electron repulsive elements, according to one or more embodiments of the invention. Intermediate doped semiconductor material 443 has a dopant concentration intermediate between that of the first example type of material 442 and semiconductor material 410. As shown, the thickness of intermediate doped semiconductor material 443 is also less than that of the material 442, but non-zero. Two different dopings may optionally be used to create these regions. One potential advantage is that the intermediate doping level in between the discrete electron repulsive elements may help to promote recombination or elimination of stray electrons in these regions. In one aspect, a relatively sinusoidal dopant concentration and thickness profile may be used.

Figure 5A:
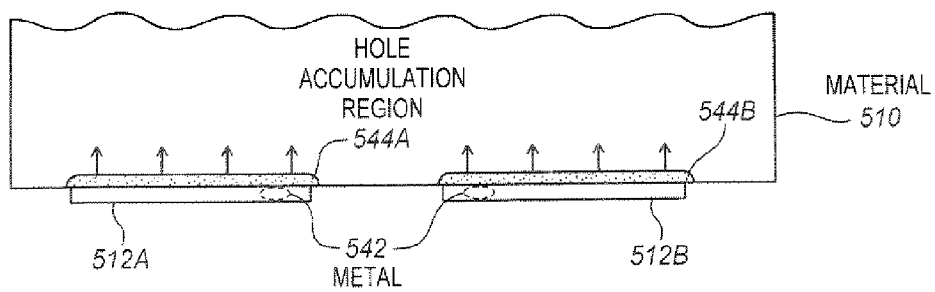
FIG. 5A shows a simplified cross-sectional side view of a portion of a photodetector array having discrete electron repulsive elements that have a second example type of material, according to one or more embodiments of the invention.

FIG. 5A shows a simplified cross-sectional side view of a portion of a photodetector array having discrete electron repulsive elements 512A, 512B that each include a second example type of material 542 that is capable of generating electric fields in a material 510, according to one or more embodiments of the invention.

The material of this embodiment includes a metal 542. Each of the electron repulsive elements includes a discrete thin metal layer or film. The thin metal layers or films are formed on the surface of the second example of material 542, such as a semiconductor material. The layers or films may be sufficiently transparent and/or sufficiently thin to allow a sufficient amount of light to pass through.

Metals 542 of discrete elements 512A, 512B may be operable to create or generate hole accumulation regions 544A, 544B, respectively, in adjacent portions of the material. For example, the metal may have a work function sufficiently high to create hole accumulation regions in the adjacent material. Platinum is one specific example of a metal that is operable to create hole accumulation regions in an adjacent silicon material. In one or more embodiments, each of the discrete electron repulsive elements may include a metal flash gate. The metal flash gate or thin metal film may optionally be negatively biased to further populate the adjacent material with holes. Flash gates are known in the arts of photodetectors, such as, for example, in conjunction with CCDs.

The hole accumulation regions formed in the material each have a greater concentration of holes than the bulk of the material. This greater concentration of holes may create an electric field in the semiconductor material.

Figure 5B:
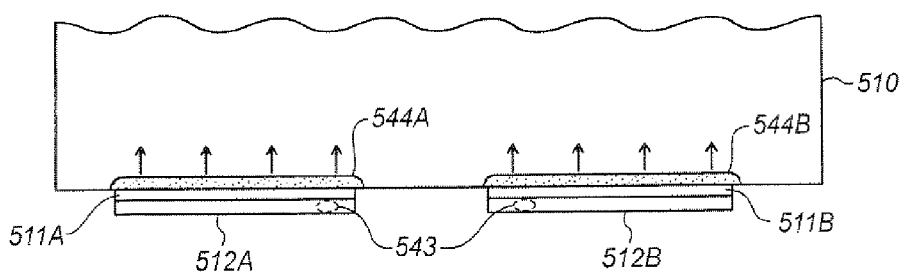
FIG. 5B shows a simplified cross-sectional side view of a portion of a photodetector array having discrete electron repulsive elements that have a third example type of material, according to one or more embodiments of the invention.

FIG. 5B shows a simplified cross-sectional side view of a portion of a photodetector array having discrete electron repulsive elements 512A, 512B that each include a third example type of material 543 that is capable of generating electric fields in a material 510, according to one or more embodiments of the invention.

Each of the electron repulsive elements includes a discrete thin layer or film. The layers or films may be sufficiently transparent and/or sufficiently thin to allow a sufficient amount of light to pass through.

In this embodiment, the third example type of material 543 includes one or more of a transparent conductive coating (TCO) and a transparent conductive coating (TCC). Examples of suitable TCOs include, but are not limited to, oxides of indium combined with oxides of tin (e.g., indium (III) oxide ($In_2O_3$) plus tin(IV) oxide ($SnO_2$)), oxides of zinc combined with oxides of aluminum (e.g., zinc oxide (ZnO) plus aluminum oxide ($Al_2O_3$), oxides of zinc combined with oxides of gallium (e.g., zinc oxide (ZnO) plus gallium (III) oxide ($Ga_2O_3$), and oxides of tin (e.g., tin oxide ($SnO_2$), to name just a few examples. Examples of suitable TCCs include, but are not limited to, a thin gold film, a heat resistive conductive plastic, and carbon nanotubes, to name just a few examples.

When the discrete electron repulsive elements are electrically negatively biased, holes in the material, such as a semiconductor material, may be attracted toward the discrete electron repulsive elements. This may generate hole accumulation regions 544A, 544B in the material. The hole accumulation regions each have a greater concentration of holes than the bulk of the material. This may create an electric field in the material.

As shown, optional discrete thin semiconductor oxide films 511A, 511B may optionally be disposed between each of the discrete electron repulsive elements 512A, 512B and material 510. In one aspect, these discrete thin semiconductor oxide films may each include an oxide of silicon, such as, for example, silicon dioxide ($SiO_2$). When discrete electron repulsive elements are negatively biased, discrete thin semiconductor oxide films may help to improve device reliability and/or to help to reduce malfunctions in devices disposed in the light detection portion of the substrate, but are optional and not required. In another embodiment, the discrete thin semiconductor oxide films may be omitted.

In photodetector arrays, the angle of the incident light on the array may not always be perpendicular or orthogonal to the surface. For example, in some implementations, the angle of the incident light on the array may be substantially orthogonal toward the center of the array, but the angle may gradually change or tilt in each direction from the center of the array toward the periphery of the array.

When the angle of the incident light is orthogonal to the surface, better performance may be achieved when the microlenses and the discrete electron repulsive elements are optically aligned directly over or under the corresponding photosensitive regions. However, when the angle of the incident light is not orthogonal to the surface, better performance may be achieved when the microlenses and the discrete electron repulsive elements are optionally shifted slightly, from such direct vertical alignment, based on the angle of the incident light.

Figure 6:
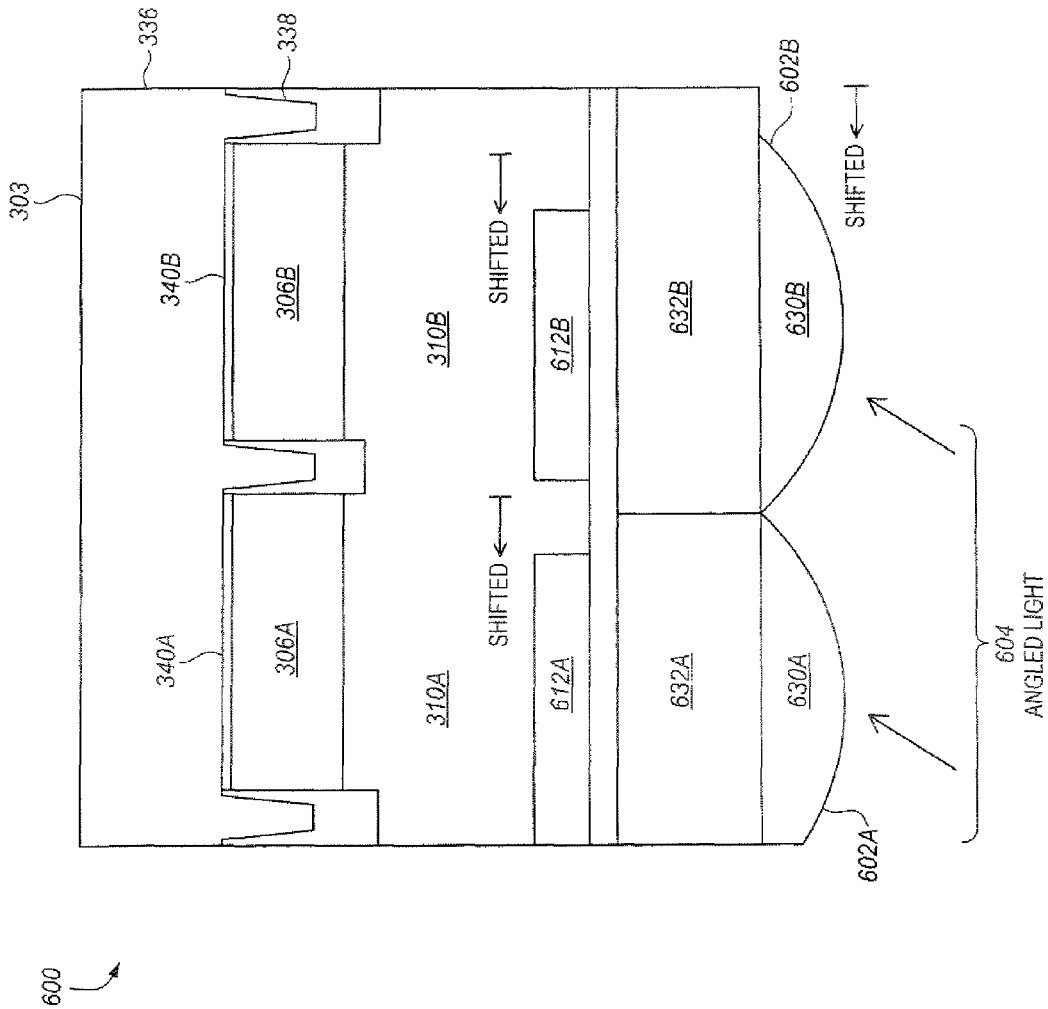
FIG. 6 is a cross-sectional side view of a backside-illuminated (BSI) photodetector array having components that are shifted based on a non-orthogonal angle of incident light, according to one or more embodiments of the invention.

FIG. 6 is a cross-sectional side view of a BSI photodetector array 600 having components that are shifted based on a non-orthogonal angle of incident light, according to one or more embodiments of the invention. Non-orthogonal light 604 is incident on a surface 602A, 602B at a non-orthogonal or tilted angle. Notice that microlenses 630A, 630B, discrete electron repulsive elements 612A, 612B, and color filters 632A, 632B have been shifted slightly to the left so that they are not aligned or centered directly under corresponding photosensitive regions 306A, 306B. This shifting helps to improve collection of the non-orthogonal light and electrons generated therefrom, but is optional and not required.

Figure 7:
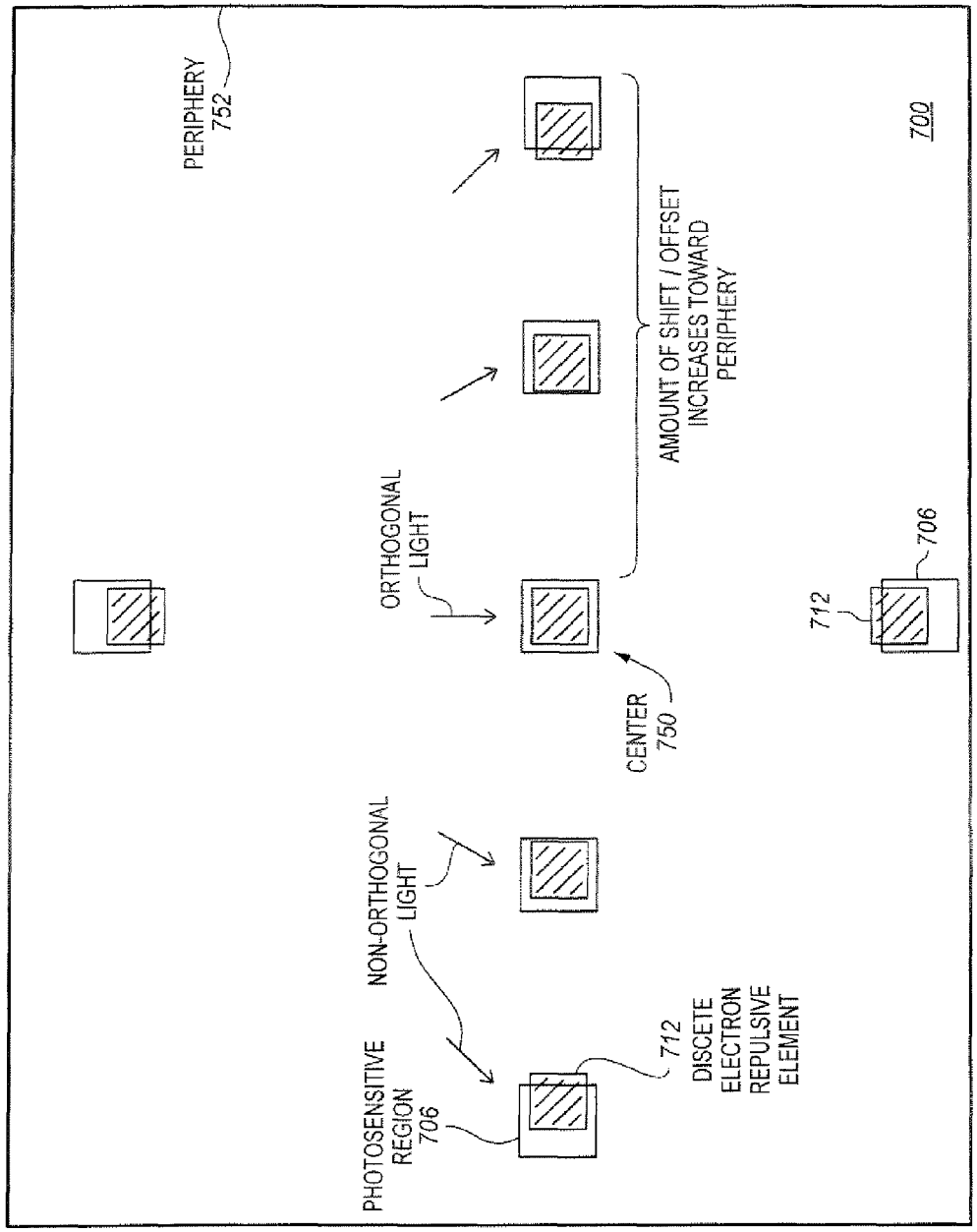
FIG. 7 is a top planar view of a photodetector array showing shifting of discrete electron repulsive elements, according to one or more embodiments of the invention.

FIG. 7 is a top planar view of an photodetector array 700 showing shifting of discrete electron repulsive elements 712, according to one or more embodiments of the invention. In this illustration, larger, un-hatched squares represent photosensitive regions 706, and smaller, hatched squares represent discrete electron repulsive elements 712. As shown, in one or more embodiments, discrete electron repulsive elements at or toward a center 750 of the array may be directly aligned over or under corresponding photosensitive regions, whereas discrete electron repulsive elements toward a periphery 752 of the array may be offset or shifted from being directly aligned over or under corresponding photosensitive regions in a direction toward the center of the array. As shown, the amount of shifting may increase with increasing distance from the center of the array toward the periphery, as the angle of light becomes less orthogonal. The amount of shifting is typically only a fraction of the pixel size, and may depend upon the pixel size, the angle of light, the size of the array, etc. Microlenses (not shown) may be shifted analogously. Such shifting may help to improve sensitivity and reduce crosstalk, but is optional and not required.

This illustration also shows that, in one or more embodiments, each of the discrete electron repulsive elements may have a shape of a square or other rectangle. Alternatively, the shape may be that of a circle, oval, triangle, or the like.

Figure 8:
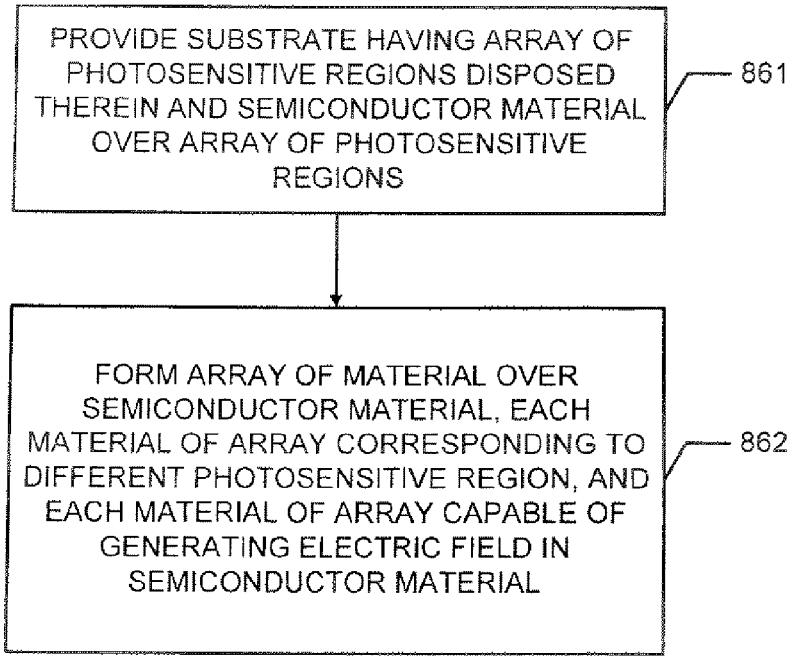
FIG. 8 is a block flow diagram of a method of making or fabricating a photodetector array including forming an array of a material that is capable of generating electric fields in a material, according to embodiments of the invention.

FIG. 8 is a block flow diagram of a method 860 of making or fabricating a photodetector array, according to embodiments of the invention. The method may be performed to fabricate any of the photodetector arrays shown in FIGS. 1, 3, 4, 5, 6, or other photodetector arrays or image sensors entirely.

The method includes providing a substrate, at block 861. The substrate has an array of photosensitive regions disposed therein and a semiconductor material over the array of photosensitive regions. In one embodiment, the substrate may look like FIG. 3 without the components 312A/B, 332A/B, 334, or 330A/B, although the invention is not so limited. As used herein, the term "providing" is intended to encompass at least fabricating, obtaining from another, purchasing, importing, and otherwise acquiring the substrate.

Then, an array of a material, such as, for example, one of the aforementioned types of electron repulsive materials, may be formed over the semiconductor material, at block 862. Each material of the array may correspond to a different photosensitive region of the array. Each material may be separated from each other material. Each material of the array may be capable of generating a separate electric field in the semiconductor material.

In one or more embodiments, each material of the array may include a p+ doped semiconductor material. A representative method of forming an array of such a material may include depositing and patterning a mask layer, such as, for example, a photoresist layer. The photoresist may be spun over the surface of the substrate into a layer. The photoresist layer may be exposed to patterned light that has been passed through a patterned mask. Then development may be used to remove portions of the exposed layer. The patterned photoresist may have openings defined therein at positions where the array of the material is to reside. Doping may be performed by ion implantation or diffusion into the semiconductor material through the mask layer. By way of example, boron may be implanted using boron fluoride or diborane. A dose of boron ions may range from about $1\times10^{12}$ to $5\times10^{15}$ ions/cm$^2$. The mask layer may be stripped or otherwise removed. The doped material may be annealed, such as with a laser.

In one or more embodiments, each material of the array may include a thin metal film of a metal such as platinum or other metal for a metal flash gate or a transparent conductive oxide (TCO), a transparent conductive coating (TCC), a TCO/oxide stack, or a TCC/oxide stack. A representative method of forming an array of such a material may include depositing and patterning a mask layer as discussed immediately above. The patterned mask layer may have openings defined therein at positions where the array of the metal material is to reside. The thin metal layer may be formed over this patterned mask layer including on the exposed semiconductor substrate at the positions where the array of the metal material is to reside. In one or more embodiments, the metal flash gate or thin metal film may be formed by flashing from about 3 to about 20 Angstroms of platinum or another suitable metal. By way of example, ion plasma or electron beam evaporation may be used. TCO and TCC thin films may be formed by sputtering, electron beam evaporation, laser beam evaporation, ion plating, etc. The flash gate or thin metal film may optionally be negatively biased to further populate the adjacent semiconductor with holes. The mask layer and any metal overlying the mask layer may then be stripped or otherwise removed.

Figure 9:
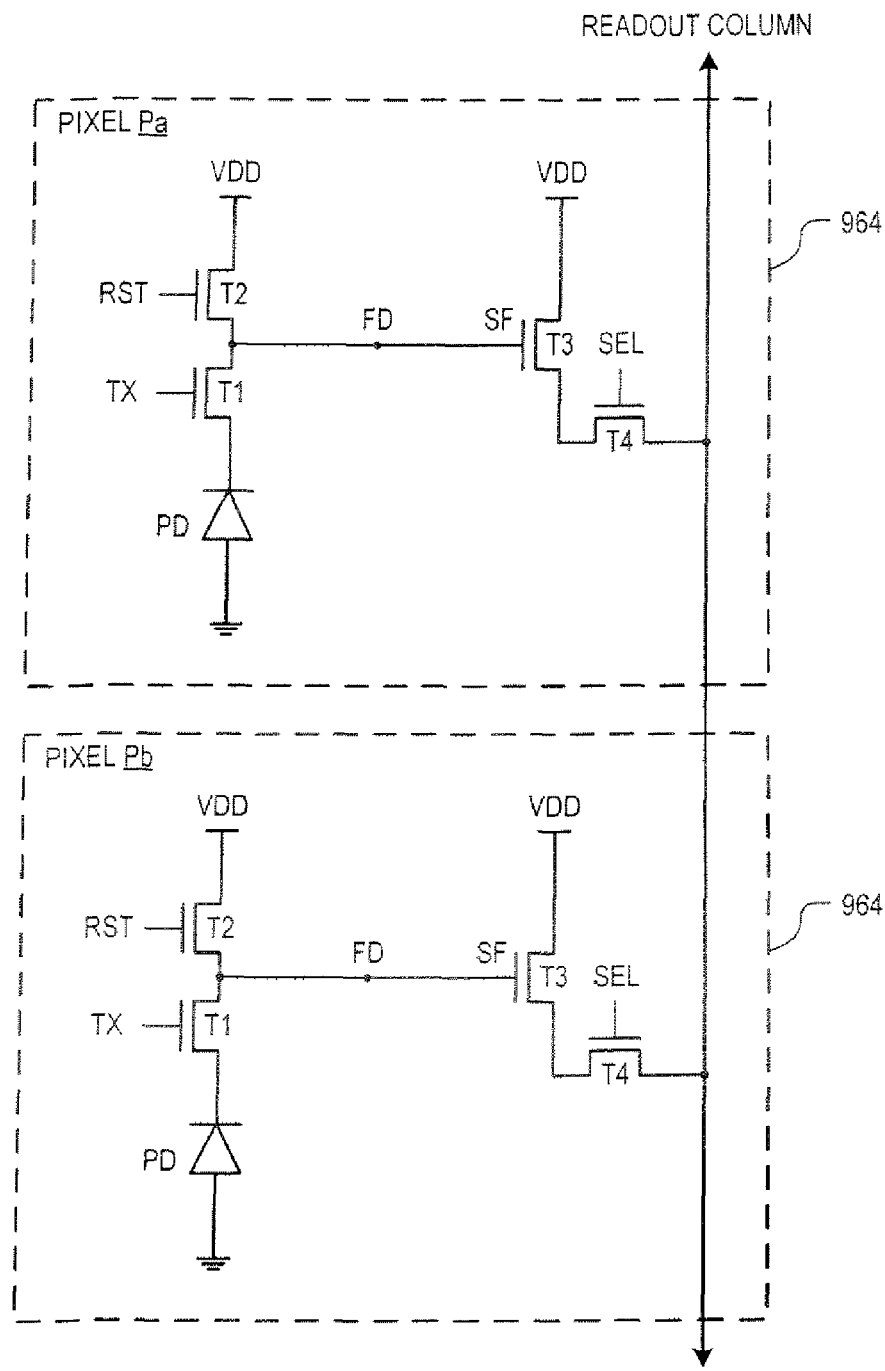
FIG. 9 is a circuit diagram illustrating example pixel circuitry of two pixels of a photodetector array, according to one or more embodiments of the invention.

FIG. 9 is a circuit diagram illustrating example pixel circuitry 964 of two four-transistor (4T) pixels of a photodetector array, according to one or more embodiments of the invention. The pixel circuitry is one possible way of implementing these two pixels within a photodetector array. However, embodiments of the invention are not limited to 4T pixel architectures. Rather, 3T designs, 5T designs, and various other pixel architectures are also suitable.

In FIG. 9, pixels Pa and Pb are arranged in two rows and one column. The illustrated embodiment of each pixel circuitry includes a photodiode PD, a transfer transistor T1, a reset transistor T2, a source-follower (SF) transistor T3, and a select transistor T4. During operation, transfer transistor T1 may receive a transfer signal TX, which may transfer the charge accumulated in photodiode PD to a floating diffusion node FD. In one embodiment, floating diffusion node FD may be coupled to a storage capacitor for temporarily storing image charges.

Reset transistor T2 is coupled between a power rail VDD and the floating diffusion node FD to reset the pixel (for example discharge or charge the FD and the PD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance connection to the floating diffusion FD. Select transistor T4 selectively couples the output of pixel circuitry to the readout column line under control of a select signal SEL.

In one embodiment, the TX signal, the RST signal, and the SEL signal are generated by control circuitry. In an embodiment where photodetector array operates with a global shutter, the global shutter signal is coupled to the gate of each transfer transistor T1 in the entire photodetector array to simultaneously commence charge transfer from each pixel's photodiode PD. Alternatively, rolling shutter signals may be applied to groups of transfer transistors T1.

Figure 10:
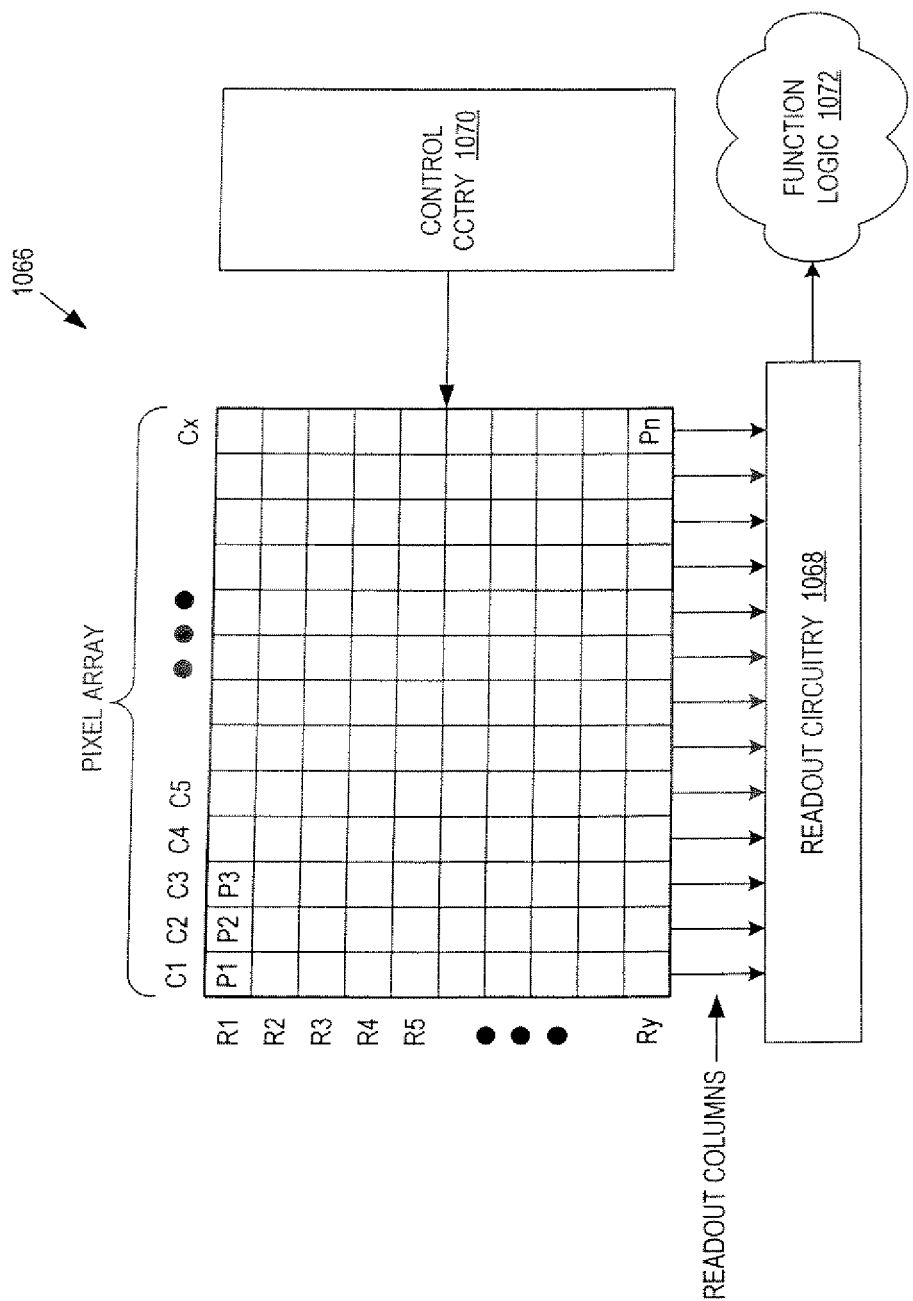
FIG. 10 is a block diagram illustrating an image sensor unit, according to one or more embodiments of the invention.

FIG. 10 is a block diagram illustrating an image sensor unit 1066, according to one or more embodiments of the invention. The image sensor unit includes a pixel array 1000, readout circuitry 1068, control circuitry 1070, and function logic 1072. In alternate embodiments, one or both of function logic and control circuitry may optionally be included outside of the image sensor unit.

The pixel array is a two-dimensional (2D) array of pixels (e.g., pixels P1, P2, . . . Pn). In one embodiment, each pixel is an active pixel sensor (APS), such as a complementary metal-oxide-semiconductor (CMOS) imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by the readout circuitry and transferred to the function logic. The readout circuitry may include amplification circuitry, analog-to-digital conversion circuitry, or otherwise. The function logic may simply store the image data or even manipulate the image data by applying post image effects (e.g., crop, rotate, remove red eye, adjust brightness, adjust contrast, or otherwise). As shown, in one embodiment, the readout circuitry may readout a row of image data at a time along readout column lines. Alternatively, the readout circuitry may readout the image data using a variety of other techniques, such as a serial readout, or a full parallel readout of all pixels simultaneously.

The control circuitry is coupled to the pixel array to control operational characteristics of the pixel array. For example, the control circuitry may generate a shutter signal for controlling image acquisition.

Figure 11:
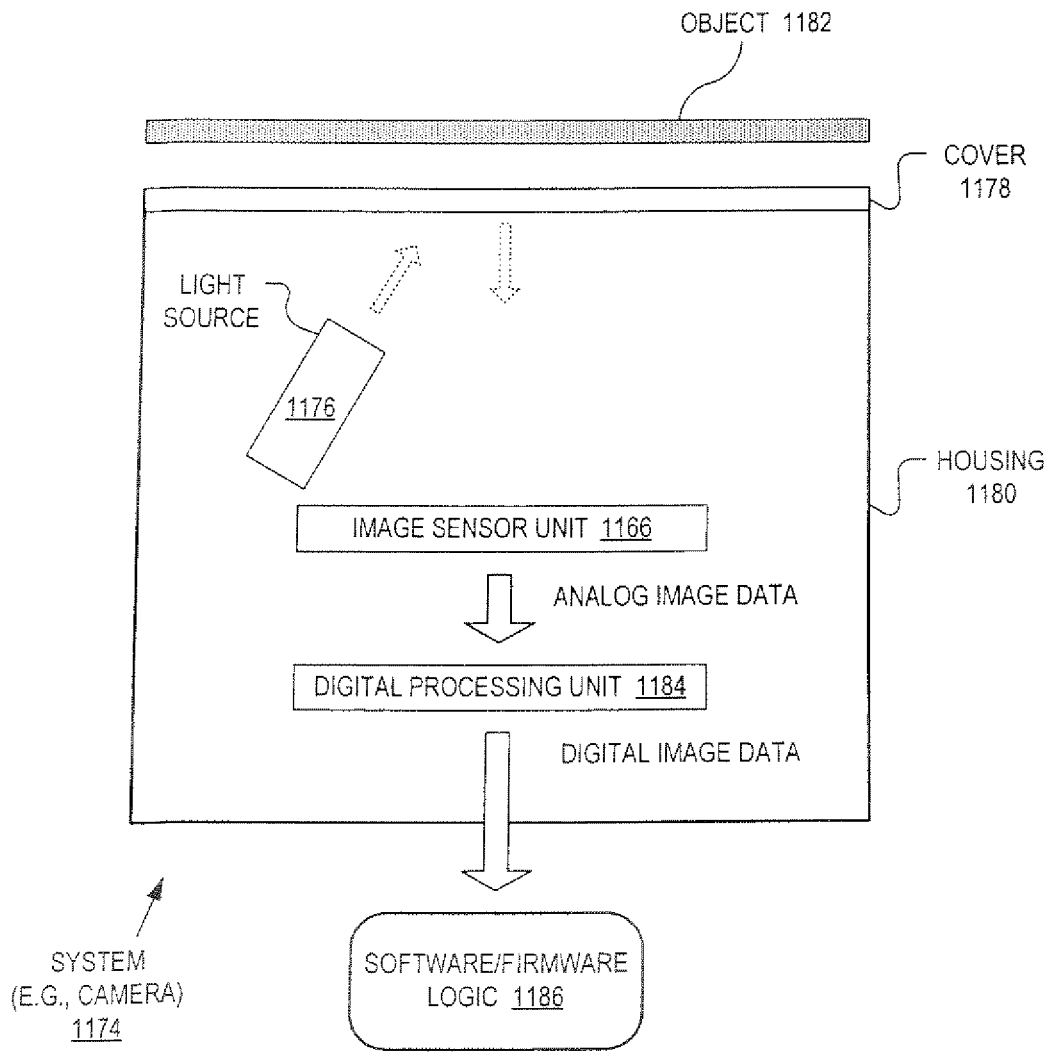
FIG. 11 is a block diagram illustrates an illumination and image capture system incorporating an image sensor, according to one or more embodiments of the invention.

FIG. 11 is a block diagram illustrates an illumination and image capture system 1174 incorporating an image sensor unit 1166, according to one or more embodiments of the invention. In various embodiments, the system may represent or be incorporated within a digital camera, a digital camera phone, a web camera, a security camera, an optical mouse, an optical microscope, to name just a few examples.

The system includes a light source 1176, such as, for example, multicolor light emitting diodes (LEDs) or other semiconductor light sources. The light source may transmit light through a cover 1178 of a housing 1180 to an object 1182 being imaged.

At least some light reflected by the object may be returned to the system through the cover to image sensor unit 1166. The image sensor unit may sense the light and may output analog image data representing the light or image.

A digital processing unit 1184 may receive the analog image data. The digital processing unit may include analog-to-digital (ADC) circuitry to convert the analog image data to corresponding digital image data.

The digital image data may be subsequently stored, transmitted, or otherwise manipulated by software/firmware logic 1186. The software/firmware logic may either be within the housing, or as shown external to the housing.

In the above description and in the claims, the terms "coupled" and "connected," along with their derivatives, may be used. These terms are not intended as synonyms for each other. Rather, "connected" means that two or more elements are in direct physical or electrical contact with each other. "Coupled" may mean that two or more elements are in direct physical or electrical contact. However, "coupled" may instead mean that two or more elements are not in direct contact with each other, but yet still co-operate or interact with each other, such as, for example, through one or more intervening components or structures. For example, a discrete electron repulsive element may be coupled between a surface and a material with one or more intervening materials (e.g., a color filter).

In the description above, for the purposes of explanation, numerous specific details have been set forth in order to provide a thorough understanding of the embodiments of the invention. It will be apparent however, to one skilled in the art, that other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

Reference throughout this specification to "one embodiment", "an embodiment", or "one or more embodiments", for example, means that a particular feature may be included in the practice of the invention. Similarly, in the description various features are sometimes grouped together in a single embodiment, figure, or description thereof, for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A backside illuminated image sensor comprising:
an array of photosensitive regions disposed within a frontside portion of a substrate;
a backside surface to receive light;
an interconnect portion on the frontside portion of the substrate;
a first material coupled between the backside surface and the array of photosensitive regions, the first material to receive the light, at least some of the light to free electrons in the first material; and an array of second material portions, the array of the second material portions coupled between the backside surface and the first material, each second material portion of the array corresponding to one of the photosensitive regions, each second material portion of the array comprising one of a doped semiconductor material that is more heavily doped than the first material and a metal capable of generating a hole accumulation region in the first material, wherein each second material portion of the array has a same thickness, wherein the photosensitive regions are of a first dopant type, wherein the substrate is of a second dopant type different than the first dopant type, wherein the second material portions are of the second dopant type.

2. The backside illuminated image sensor of claim 1, wherein each of the second material portions of the array overlies only one photosensitive region.

3. The backside illuminated image sensor of claim 1, wherein an extent of each of the second material portions of the array is less than an extent of a corresponding photosensitive region.

4. The backside illuminated image sensor of claim 1, wherein the array of the second material portions does not comprise an uninterrupted layer.

5. The backside illuminated image sensor of claim 1, wherein the second material portions comprise a p+ doped semiconductor material.

6. The backside illuminated image sensor of claim 1, further comprising a semiconductor light source to transmit light toward an object being imaged.

7. A backside illuminated image sensor comprising:
an array of photosensitive regions disposed within a frontside portion of a substrate;
a backside surface to receive light;
interconnects on the frontside portion of the substrate;
a semiconductor material coupled between the backside surface and the array of photosensitive regions, the semiconductor material to receive the light, at least some of the light to free electrons in the semiconductor material; and
an array of heavily doped semiconductor material portions coupled between the backside surface and the semiconductor material, each of the heavily doped semiconductor material portions corresponding to one of the photosensitive regions, each of the heavily doped semiconductor material portions comprising a heavily doped semiconductor material portion that is more heavily doped than the semiconductor material, wherein each heavily doped semiconductor material portion has a same thickness, wherein the photosensitive regions are of a first dopant type, wherein the substrate is of a second dopant type different than the first dopant type, wherein the heavily doped semiconductor material portions are of the second dopant type.

8. The backside illuminated image sensor of claim 7, wherein an extent of each of the second material portions of the array is less than an extent of a corresponding photosensitive region.

9. The backside illuminated image sensor of claim 7, wherein the array of the second material portions does not comprise an uninterrupted layer.

10. The backside illuminated image sensor of claim 7, further comprising a semiconductor light source to transmit light toward an object being imaged.

\* \* \* \* \*